United States Patent
Lin et al.

(10) Patent No.: US 7,187,909 B2
(45) Date of Patent: Mar. 6, 2007

(54) CURRENT MODE TRANSMITTER

(75) Inventors: Heng-Chih Lin, Plano, TX (US);
Ranjit Gharpurey, Ann Arbor, MI (US); Paul A. Fontaine, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 388 days.

(21) Appl. No.: 10/811,704

(22) Filed: Mar. 29, 2004

(65) Prior Publication Data
US 2005/0213672 A1    Sep. 29, 2005

(51) Int. Cl.
*H04B 1/02* (2006.01)
*H04B 17/00* (2006.01)

(52) U.S. Cl. .................. 455/91; 455/118; 455/115.3

(58) Field of Classification Search .............. 455/91, 455/108, 118, 114.2, 114.3, 73, 87, 550.1, 455/39, 42, 115.3
See application file for complete search history.

(56) References Cited

U.S. PATENT DOCUMENTS

| | | | | |
|---|---|---|---|---|
| 5,893,027 | A | * | 4/1999 | Brueske ...................... 455/118 |
| 6,169,445 | B1 | * | 1/2001 | Tanase ....................... 327/538 |
| 6,259,301 | B1 | * | 7/2001 | Gailus et al. ............... 327/355 |
| 6,320,417 | B1 | * | 11/2001 | Kirsch et al. ................. 326/86 |
| 6,909,884 | B2 | * | 6/2005 | Sourour et al. ............ 455/108 |
| 2005/0174147 | A1 | * | 8/2005 | Chang et al. ............... 326/115 |

* cited by examiner

*Primary Examiner*—Sonny Trinh
(74) *Attorney, Agent, or Firm*—Steven A. Shaw; W. James Brady; Frederick J. Telecky, Jr.

(57) ABSTRACT

A current-domain transmitter is configured to receive an input signal and provide a transmitted signal. The transmitter has a plurality of elements, operatively arranged between the input signal and the transmitted signal and configured to represent the input signal with respective electric currents whose respective current magnitudes are each substantially proportional to the input signal. The elements may include a current-steering digital-to-analog converter (DAC), a current mode filter (such as an LPF), a current mode mixer, and/or a current mode amplifier.

9 Claims, 1 Drawing Sheet

CURRENT MODE TRANSMITTER

BACKGROUND OF THE INVENTION

1. Field of the Invention

The invention generally relates to transmitters. More particularly, the invention relates to transmitters that operate completely in the current domain to provide more "headroom" even in low voltage, high signal bandwidth scenarios.

2. Related Art

FIG. 1 shows a transmitter including, in series, a digital-to-analog converter (DAC) 102, a low-pass reconstruction filter (LPF) 104, an up-conversion mixer 106, a power amplifier (PA) 108, and an antenna 110. Conventionally, operations within the transmitter elements have been in the "voltage domain." That is, signal voltages (as distinguished from currents) have been linearly related to the quantity that the signals represent. In this disclosure, such transmitters are termed "voltage mode transmitters."

The low power supply magnitude required by deep sub-micron CMOS technology creates a "headroom" issue: signals cannot traverse a wide range without becoming non-linear with respect to the quantity that the signals are supposed to represent (usually, the baseband signal input to the transmitter). Lacking headroom not only means that linearity in general is limited, but also that the 1 dB compression point is reduced.

Generally, the current-voltage (I-V) transfer characteristics of CMOS (complementary metal oxide semiconductor) transistors is a quadratic relationship, with current being proportional to the square of voltage. Especially when the bandwidth of the baseband signal is high (in the hundreds of megahertz to a few gigahertz), a current steering DAC is employed. In this scenario, the baseband input signal is in the form of a current that must be converted eventually, possibly by modulation to a voltage (proportional to the square root of current) to drive an antenna or other load that is in the form of a linear or nearly linear resistance. Unfortunately, this current-to-voltage conversion requires not only special linearization techniques in the up-conversion mixer, but also demands extra biasing circuitry, including large capacitors, for DC level shifting.

Specifically, in conventional voltage mode operation, the input needs to be AC coupled to the next stage. As a result, not only must an AC coupling capacitor be inserted along the input signal path, but also a biasing circuit may be needed to properly bias the node on the downstream side of the AC coupling capacitor, and a degeneration network may have to be connected to the load to increase linearity.

Accordingly, conventional voltage mode transmitters are inherently complicated in design, and are especially unsuited for low voltage, high bandwidth applications that are of growing importance as semiconductor device sizes are reduced. Thus, there is a need in the art to provide a transmitter that is simple in design, yet provides signals that accurately represent quantities over a wide linear range and with expanded headroom.

SUMMARY

A current-domain transmitter is configured to receive an input signal and provide a transmitted signal. The transmitter has a plurality of elements, operatively arranged between the input signal and the transmitted signal and configured to represent the input signal with respective electric currents whose respective current magnitudes are each substantially proportional to the input signal.

BRIEF DESCRIPTION OF THE DRAWINGS

A more complete appreciation of the described embodiments is better understood by reference to the following Detailed Description considered in connection with the accompanying drawings, in which like reference numerals refer to identical or corresponding parts throughout, and in which.

DETAILED DESCRIPTION

Figures 1, 2:
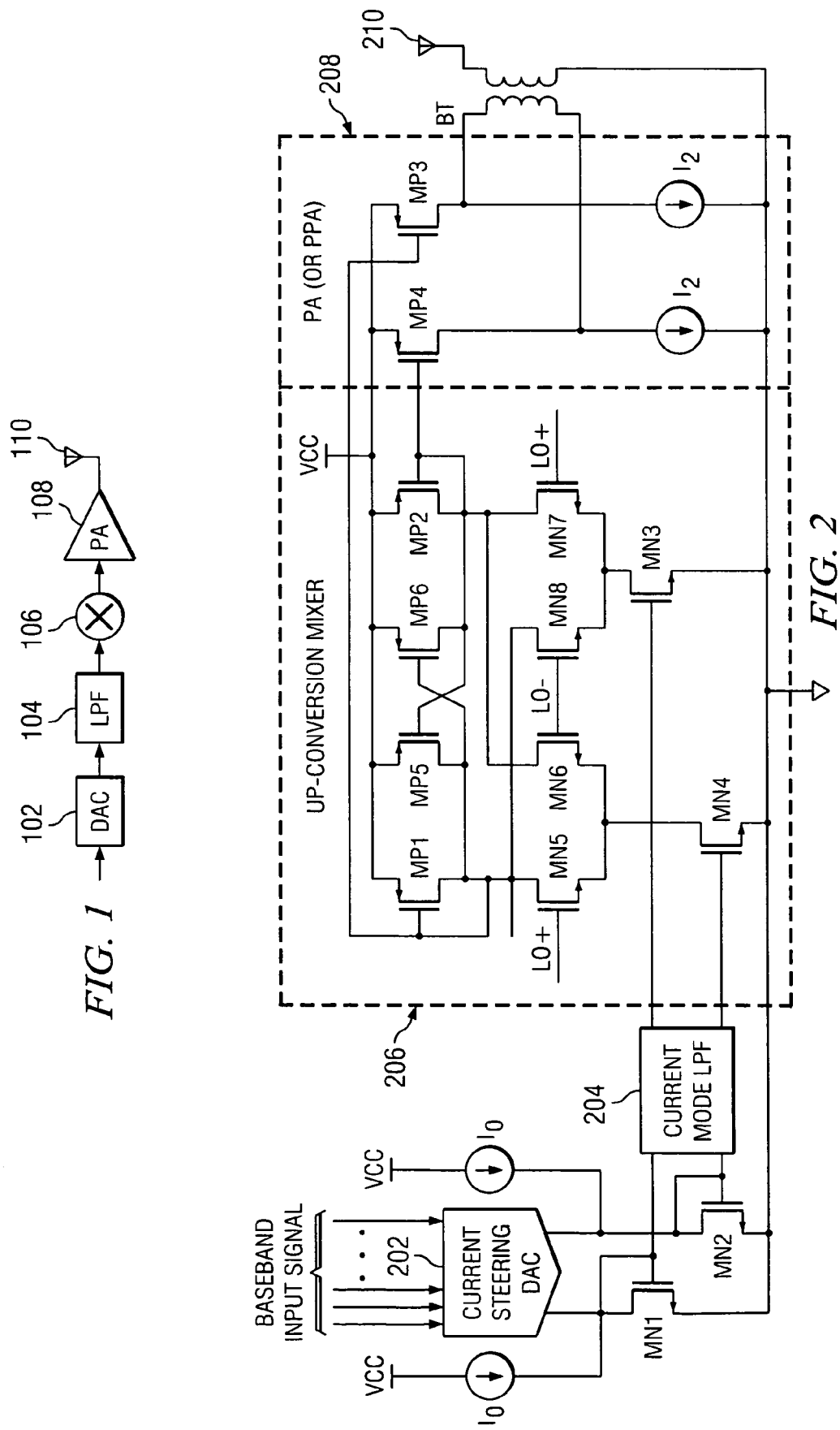
FIG. 1 is a high level block diagram of a transmitter arrangement in which the present invention may be employed.
FIG. 2 is a circuit diagram illustrating one embodiment of a current mode transmitter.

In describing embodiments illustrated in the drawings, specific terminology is employed for the sake of clarity. However, the invention is not intended to be limited to the specific terminology so selected, and it is to be understood that each specific element includes all technical equivalents that operate in a similar manner to accomplish a similar purpose. Various terms that are used in this specification are to be given their broadest reasonable interpretation when used to interpret the claims.

Moreover, features and procedures whose implementations are well known to those skilled in the art are omitted for brevity. For example, the design, selection, and implementation of basic electronic circuit elements such as signal level shifters, converters, filters, buffers, drivers, logic elements, current and voltage sources, transformers, diodes, bipolar transistors, metal oxide semiconductor field effect transistors (MOSFETs), delay elements, antennas, and the like, lie within the ability of those skilled in the art, and accordingly any detailed discussion thereof may be omitted. As one example, it is known that many current mode devices, such as current-steering DACs, operate by providing two output currents whose relative magnitudes are determined by the input(s) to the device: specifically, if an input to a current-steering DAC is 00, then a first output might provide no current and the second output would provide all of the current; if the input is 01, then the first output would provide one-third of the total current and the second output would provide two-thirds of the total current; if the input is 10, then the first output would provide two-thirds of the total current and the second output would provide one-third of the total current; and if the input is 11, the first output would provide all of the current and the second output would provide no current.

Referring to FIG. 2, an embodiment of a current mode transmitter is illustrated. As used herein, the terms "current mode" and "current domain" mean that the signals that represent the quantity that is to be communicated (generally meaning the baseband input signal) are linearly related to the quantity as electric currents, as distinguished from electric voltages.

A current steering digital-to-analog converter (DAC) 202, which may be conventional in design, receives a series of digital input values representing the baseband input signal. Prior to entering DAC 202, the signal may have undergone modulation such as amplitude, frequency, or phase modulation. Current-steering DAC 202 converts the baseband input signal to an analog differential current signal. The differential current signal is presented on two outputs that are also driven by two identical current sources, both of which are labeled $I_0$. The current sources help to ensure that minimum current is experienced on both legs. The two DAC outputs drive the drains and gates of respective n-channel metal oxide semiconductor field effect transistors (MOSFETs) MN1 and MN2. The sources of MN1 and MN2 are connected to a ground level node.

The differential current signal from current steering DAC 202 also drives a current mode filter such as a current mode low pass filter (LPF) 204 or a current mode band-pass filter, which may also be of conventional design. LPF 204 provides differential input currents to the gates of respective n-channel MOSFETs MN3, MN4, which may be considered the signal inputs to an up-conversion mixer 206. The sources of MN3, MN4 are connected to ground, and the drains of MN3 and MN4 are connected to the sources of n-channel MOSFETs MN7, MN8 and MN4, MN5, respectively. MN1 and MN3 are a current mirror pair through the current mode filter, as are MN2 and MN4. That is, the drain current of MN3 is a filtered and possibly amplified version of the drain current of MN1, the drain current of MN4 is a filtered and possibly amplified version of the drain current of MN2. Accordingly, MN3, MN4 mirror MOSFETs MN1, MN2, and thus carry current proportional to the baseband input signal.

Up-conversion mixer 206 converts the baseband current signal (drain currents of MN3 and MN4 into modulated RF high frequency signals. Within up-conversion mixer 206, the gates of MN5 and MN7 receive a positive LO+ (local oscillator) signal, while the gates of MN6 and MN8 receive a negative LO− (local oscillator) signal. The drains of MN6 and MN7 are connected to the drain and gate of a p-channel MOSFET MP2, while the drains of MN5 and MN8 are connected to the drain and gate of a p-channel MOSFET MP1. The sources of MP1 and MP2 are connected to a voltage source that may be commonly labeled VCC. MP1 and MP2 may be considered to provide the output load of mixer 206.

Optionally, to provide higher mixer gain, p-channel MOSFETs MP5, MP6 may be included. The drains of MP5 and MP6 are respectively connected to the connected drains/gates of MP2 and MP1. The sources of MP5, MP6 are connected to source voltage VCC. MP5 and MP6 are cross-coupled, in the sane that the gate of MP5 is connected to the drain of MP6, and the gate of MP6 is connected to the drain of MP5.

LO+ and LO− may be, for example, 1–3 GHz sine waves (alternatively, square waves) that allow the up-conversion mixer 206 to perform its upward frequency conversion function. Thus, sine wave currents (alternatively, square wave currents) constituting a carrier signal are modulated by the input signal driving MN3, MN4, ultimately controlling MP1 and MP2. LO+ and LO− are of the same frequency, which can be from 100 MHz to 10 GHz or beyond, depending on the application. For example, for WLANs LO+ and LO− may be either about 2.4 GHz or about 5 GHz; for GSM cellular, about 900 MHz; if the baseband signal is within ±10 MHz, then if LO+ and LO−=2.4 GHz, the output of the mixer (the currents of MP1 and MP2) are between 2.39 GHz and 2.41 GHz.

The gates of MP1, MP2 drive the gates of p-channel MOSFETs MP3, MP4 that constitute inputs to a power amplifier (PA) 208 (or, alternatively, a pre-power amplifier (PPA)). The signal information on the gates of MP1 and MP2 controls MP3 and MP4, respectively, within power amplifier (PA) 208. The sources of MP3 and MP4 are connected to a voltage source VCC, while their drains are connected to ground through respective identical current sources, each labeled $I_2$.

The nodes at the drains of MP3 and MP4 are the current output nodes of the power amplifier 208, driving the respective input leads of the primary winding of a transformer. The transformer may be implemented as a conventional balun transformer BT. The second winding of BT is connected between a transmitting antenna 210 and ground. Alternatively, the current mode transmitter can be applied to wire line communication channel, in which case the balun transformer and antenna are replaced with a cable of other transmission medium. In either event, the differential signals that are input to the gates of MP3 and MP4 control the current that drives the output, be it a transmission line or the primary winding of the BT which in turn determines the signal transmitted from antenna 210.

Thus, FIG. 2 shows how signals from output of current steering DAC 202, through the current mode LPF 204, the up-conversion mixer 206, and the power amplifier 208 to the output of the entire transmitter, are all in the current domain. Notably, no biasing circuits including large capacitors are needed as they would be required by voltage domain circuits, for example, between the DAC and the mixer or between the mixer and the power amplifier.

As noted above, in the operating range of interest in CMOS transistors, current is generally proportional to the square of the voltage. By implication, a transmitter operating in the current domain effectively compresses the voltage, thus increasing headroom and expanding the 1 dB compression point. Especially when, as in FIG. 2, antennas or other output loads are usually linear resistances, a high degree of signal linearity is achieved. Furthermore, the entire transmitter can be DC coupled, thus conserving power and avoiding a biasing circuit that would be required if signals were in the voltage domain. Thus, the current mode transmitter described herein is easier to design, consumes less power, occupies less area, and experiences less noise, than conventional voltage mode transmitters.

The present disclosure supports a current-domain transmitter configured to receive an input signal and provide a transmitted signal, the transmitter a plurality of elements, operatively arranged between the input signal and the transmitted signal and configured to represent the input signal with respective electric currents whose respective current magnitudes are each substantially proportional to the input signal.

A first of the elements may be a current mode mixer, operating completely in the current domain, configured to receive a current domain signal representing the input signal as an electric current, and to provide an up converted current domain signal from which the transmitted signal is derived.

A second of the elements may be a current mode amplifier, operating completely in the current domain, configured to receive the up converted current-domain signal and to output an amplified current-domain signal to a load element from which the transmitted signal is derived.

A third of the elements may be a current mode filter, operating completely in the current domain, configured to receive differential current signals representing the input signal, and to provide to the current mode mixer the current-domain signal representing the input signal.

A fourth of the elements may be a current-steering digital-to-analog converter (DAC) configured to receive the input signal and to provide the differential current signals to the current mode filter.

The current mode mixer may include a first pair of transistors configured to receive respective pairs of current signals collectively representing the current-domain signal representing the input signal, and a plurality of up-conversion transistors, responsive to the first pair of transistors and responsive to at least one high-frequency signal, and configured to provide the up-converted current-domain signal from which the transmitted signal is derived.

The current mode mixer may further include a second pair of transistors, operating cooperatively with the plurality of up conversion transistors to provide the up-converted current-domain signal from which the transmitted signal is derived.

The present disclosure also supports a current-domain transmitter configured to receive an input signal and provide a transmitted signal. The transmitter may have a current-steering digital-to-analog converter (DAC) configured to receive the input signal and to provide differential current signals representing the input signal; a current mode filter, configured to receive the differential current signals representing the input signal, and to provide a filtered version of the differential current signals representing the input signal; a current-mode up-conversion mixer configured to receive the filtered version, whose current magnitude is substantially proportional to the input signal, and to apply at least a high frequency carrier signal to an internal current-domain signal within the mixer that also has a current magnitude substantially proportional to the input signal, so as to provide a high frequency modulated output current-domain signal whose envelope magnitude is substantially proportional to the input signal; and a current-mode power amplifier configured to receive the high-frequency modulated output current-domain signal and to provide an amplified high-frequency modulated output current signal from which the transmitted signal is derived.

The current mode mixer may include a first pair of transistors configured to receive respective pairs of current signals collectively representing the current-domain signal representing the input signal, and a plurality of up-conversion transistors, responsive to the first pair of transistors and responsive to at least one high-frequency signal, and configured to provide the up-converted current-domain signal from which the transmitted signal is derived.

The current mode mixer may further include a second pair of transistors, operating cooperatively with the plurality of up conversion transistors to provide the up-converted current-domain signal from which the transmitted signal is derived.

The present disclosure further supports a method of providing a transmitted signal in response to an input signal. The method may involve converting the input signal to an input current-domain signal whose current magnitude substantially linearly represents the input signal, up frequency-converting the input current-domain signal to a high-frequency current-domain signal having an envelope that substantially linearly represents the input signal, and magnitude-amplifying the high-frequency current-domain signal to provide a signal from which the transmitted signal is derived.

The converting step may include using a current-steering digital-to-analog converter (DAC) to provide differential current signals that represent the input signal, and using a current mode filter operating completely in the current domain to receive the differential current signals that represent the input signal, and to provide the input current domain signal that us used in the up-frequency-converting step.

The foregoing embodiments are merely examples and are not to be construed as limiting the invention. The present teachings can be readily applied to other scenarios. The description of the embodiments is intended to be illustrative, and not to limit the scope of the claims. Numerous alternatives, modifications and variations of the present invention are possible in light of the above teachings. For example, the particular technology and topology involved in implementing the circuit elements, and the particular design of the circuits, may be varied while still remaining within the scope of the invention. It is therefore to be understood that within the scope of the appended claims and their equivalents, the invention may be practiced otherwise than as specifically described herein.

What is claimed is:

1. A current-domain transmitter configured to receive an input signal and provide a transmitted signal, the transmitter comprising:
   a plurality of elements, operatively arranged between the input signal and the transmitted signal and configured to represent the input signal with respective electric currents whose respective current magnitudes are each substantially proportional to the input signal, said plurality of elements comprising:
   a current mode mixer, operating completely in the current domain, configured to receive a current-domain signal representing the input signal as an electric current, and to provide an up-converted current-domain signal from which the transmitted signal is derived; and
   a current mode amplifier, operating completely in the current domain, configured to receive the up-converted current-domain signal and to output an amplified current-domain signal to a load element from which the transmitted signal is derived.

2. The transmitter of claim 1, wherein a third of the elements is:
   a current mode filter, operating completely in the current domain, configured to receive differential current signals representing the input signal, and to provide to the current mode mixer the current-domain signal representing the input signal.

3. The transmitter of claim 2, wherein a fourth of the elements is:
   a current-steering digital-to-analog converter (DAC) configured to receive the input signal and to provide the differential current signals to the current mode filter.

4. The transmitter of claim 1, wherein the current mode mixer includes:
   a first pair of transistors configured to receive respective pairs of current signals collectively representing the current-domain signal representing the input signal; and
   a plurality of up-conversion transistors, responsive to the first pair of transistors and responsive to at least one high-frequency signal, and configured to provide the up-converted current-domain signal from which the transmitted signal is derived.

5. The transmitter of claim 4, wherein the current mode mixer further includes:
   a second pair of transistors, operating cooperatively with the plurality of up-conversion transistors to provide the up-converted current-domain signal from which the transmitted signal is derived.

6. A current-domain transmitter configured to receive an input signal and provide a transmitted signal, the transmitter comprising:
   a current-steering digital-to-analog converter (DAC) configured to receive the input signal and to provide differential current signals representing the input signal;

a current mode filter, configured to receive the differential current signals representing the input signal, and to provide a filtered version of the differential current signals representing the input signal;

a current-mode up-conversion mixer configured to receive the filtered version, whose current magnitude is substantially proportional to the input signal, and to apply at least a high frequency carrier signal to an internal current-domain signal within the mixer that also has a current magnitude substantially proportional to the input signal, so as to provide a high-frequency modulated output current-domain signal whose envelope magnitude is substantially proportional to the input signal; and a current-mode power amplifier configured to receive the high-frequency modulated output current-domain signal and to provide an amplified high-frequency modulated output current signal from which the transmitted signal is derived.

7. The transmitter of claim 6, wherein the current mode mixer includes:

a first pair of transistors configured to receive respective pairs of current signals collectively representing the current-domain signal representing the input signal; and a plurality of up-conversion transistors, responsive to the first pair of transistors and responsive to at least one high-frequency signal, and configured to provide the up-converted current-domain signal from which the transmitted signal is derived.

8. The transmitter of claim 7, wherein the current mode mixer further includes:

a second pair of transistors, operating cooperatively with the plurality of up-conversion transistors to provide the up-converted current-domain signal from which the transmitted signal is derived.

9. A method of providing a transmitted signal in response to an input signal, the method comprising:

converting the input signal to an input current-domain signal whose current magnitude substantially linearly represents the input signal using a current-steering digital-to-analog converter (DAC) to provide differential current signals that represent the input signal and using a current mode filter operating completely in the current domain to receive the differential current signals that represent the input signal, and to provide the input current-domain signal that is used in the up-frequency-converting step;

up-frequency-converting the input current-domain signal to a high-frequency current-domain signal having an envelope that substantially linearly represents the input signal; and magnitude-amplifying the high-frequency current-domain signal to provide a signal from which the transmitted signal is derived.

* * * * *